(12) United States Patent
Setlur et al.

(10) Patent No.: US 9,929,319 B2
(45) Date of Patent: Mar. 27, 2018

(54) LED PACKAGE WITH RED-EMITTING PHOSPHORS

(71) Applicant: General Electric Company, Schenectady, NY (US)

(72) Inventors: Anant Achyut Setlur, Niskayuna, NY (US); Stanton Earl Weaver, Broadalbin, NY (US); Thomas Bert Gorczyca, Schenectady, NY (US); Ashfaqul Islam Chowdhury, Broadview Heights, OH (US); James Edward Murphy, Niskayuna, NY (US); Florencio Garcia, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 121 days.

(21) Appl. No.: 14/304,098

(22) Filed: Jun. 13, 2014

(65) Prior Publication Data

US 2015/0364659 A1    Dec. 17, 2015

(51) Int. Cl.
*H01L 33/50* (2010.01)
*C09K 11/61* (2006.01)
(Continued)

(52) U.S. Cl.
CPC .......... *H01L 33/504* (2013.01); *C09K 11/617* (2013.01); *C09K 11/7774* (2013.01);
(Continued)

(58) Field of Classification Search
CPC ... H01L 33/501; H01L 33/505; H01L 33/507; H01L 33/55; H01L 33/0054
See application file for complete search history.

(56) References Cited

U.S. PATENT DOCUMENTS 2,522,074 A    9/1950  Urbach
3,576,756 A    4/1971  Russo
(Continued)

FOREIGN PATENT DOCUMENTS

CN    102827601 A    12/2012
CN    102851026 A    1/2013
(Continued)

OTHER PUBLICATIONS

Tozawa et al, Apr. 4, 2013, WO 2013/047606.*
(Continued)

*Primary Examiner* — Sue A Purvis
*Assistant Examiner* — Suberr Chi
(74) *Attorney, Agent, or Firm* — Pabitra K. Chakrabarti

(57) ABSTRACT

A process for fabricating a LED lighting apparatus includes disposing a composite coating on a surface of a LED chip. The composite coating comprises a first composite layer having a manganese doped phosphor of formula I and a first binder, and a second composite layer comprising a second phosphor composition and a second binder. The first binder, the second binder or both include a poly(meth)acrylate.

$$A_x[MF_y]:Mn^{4+} \qquad (I)$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the [MF$_y$] ion;
y is 5, 6 or 7.

8 Claims, 3 Drawing Sheets

(51) Int. Cl.
*H01L 33/00* (2010.01)
*C09K 11/77* (2006.01)

(52) U.S. Cl.
CPC .......... *H01L 33/005* (2013.01); *H01L 33/502* (2013.01); *H01L 2224/48247* (2013.01); *H01L 2224/48257* (2013.01); *H01L 2924/181* (2013.01); *H01L 2933/0041* (2013.01)

(56) References Cited

U.S. PATENT DOCUMENTS

| | | | |
|---|---|---|---|
| 4,479,886 | A | 10/1984 | Kasenga |
| 6,103,296 | A | 8/2000 | McSweeney |
| 7,270,773 | B2 | 9/2007 | Manivannan et al. |
| 7,358,542 | B2 | 4/2008 | Radkov et al. |
| 7,422,703 | B2 | 9/2008 | Yi et al. |
| 7,497,973 | B2 | 3/2009 | Radkov et al. |
| 7,648,649 | B2 | 1/2010 | Radkov et al. |
| 7,847,007 | B2* | 12/2010 | Kawato .................. C08L 69/00 524/132 |
| 7,847,309 | B2 | 12/2010 | Radkov et al. |
| 8,057,706 | B1 | 11/2011 | Setlur et al. |
| 8,252,613 | B1 | 8/2012 | Lyons et al. |
| 8,362,685 | B2 | 1/2013 | Masuda et al. |
| 8,427,042 | B2 | 4/2013 | Hata et al. |
| 8,491,816 | B2 | 7/2013 | Hong et al. |
| 8,497,623 | B2 | 7/2013 | Oguma et al. |
| 8,593,062 | B2 | 11/2013 | Murphy et al. |
| 8,703,016 | B2 | 4/2014 | Nammalwar et al. |
| 8,710,487 | B2 | 4/2014 | Lyons et al. |
| 2009/0001869 | A1 | 1/2009 | Tanimoto et al. |
| 2009/0272995 | A1* | 11/2009 | Ito .......................... C04B 35/581 257/98 |
| 2010/0090585 | A1 | 4/2010 | Seto et al. |
| 2010/0091215 | A1 | 4/2010 | Fukunaga et al. |
| 2010/0291313 | A1* | 11/2010 | Ling ...................... C09K 11/02 427/475 |
| 2011/0069490 | A1 | 3/2011 | Liu |
| 2011/0210358 | A1* | 9/2011 | Kim et al. ...................... 257/98 |
| 2011/0284866 | A1* | 11/2011 | Tran et al. ...................... 257/76 |
| 2012/0256125 | A1 | 10/2012 | Kayneyoshi et al. |
| 2012/0305972 | A1* | 12/2012 | Meyer et al. .................... 257/98 |
| 2013/0136930 | A1* | 5/2013 | Kato .................... H05K 1/0373 428/418 |
| 2013/0241396 | A1 | 9/2013 | Hiramatsu et al. |
| 2013/0264937 | A1 | 10/2013 | Sakuta et al. |
| 2013/0271960 | A1 | 10/2013 | Hong et al. |
| 2015/0008455 | A1* | 1/2015 | Tozawa .................. H01L 33/60 257/88 |
| 2015/0069299 | A1 | 3/2015 | Pan et al. |

FOREIGN PATENT DOCUMENTS

| | | |
|---|---|---|
| EP | 1807354 B1 | 11/2008 |
| EP | 2629341 A1 | 8/2013 |
| GB | 1360690 A | 7/1974 |
| JP | 2013-014715 A | 1/2013 |
| JP | 2013-060506 A | 4/2013 |
| WO | 2009005035 A1 | 1/2009 |
| WO | 2009119486 A1 | 10/2009 |
| WO | 2011073951 A2 | 6/2011 |
| WO | 2013088313 A1 | 6/2013 |
| WO | 2013121355 A1 | 8/2013 |
| WO | 2013138347 A1 | 9/2013 |
| WO | 2013144919 A1 | 10/2013 |
| WO | 2013158929 A1 | 10/2013 |
| WO | 2014068440 A1 | 5/2014 |

OTHER PUBLICATIONS

Black et al., "Excitation and luminescence spectra of dipotassium hexafluoromanganate(IV)", Journal of the Chemical Society, Royal Society of Chemistry, Dalton Transactions, 1974, 977-981, Issue 9.
Takahashi et al., "Mn4+-Activated Red Photoluminescence in K2SiF6 Phosphor", Journal of The Electrochemical Society, pp. E183-E188, vol. 155, Issue 12, 2008.
International Search Report and Written Opinion dated Jul. 14, 2014 which was issued in connection with PCT Patent Application No. PCT/US2014/027733.
Bera et al.,"Optimization of the Yellow Phosphor Concentration and Layer Thickness for Down-Conversion of Blue to White Light", Display Technology, Journal of, Dec. 2010, pp. 645-651, vol. 6 , Issue: 12 . . . .
Anant Achyut Setlur et al., "LED Package With Red-Emitting Phosphors"; U.S. Appl. No. 14/073,141, filed Nov. 6, 2013; 14 Pages.
Megan Marie Brewster et al., "Phosphor Assembly for Light Emitting Devices"; U.S. Appl. No. 13/875,534, filed May 2, 2013; 20 Pages.
Frayret et al., "Solubility of (NH4)2SiF6, K2SiF6 and Na2SiF6 in acidic solutions", Chemical Physics Letters, Aug. 2006, pp. 356-364, vol. 427, Issue 4.
Paulusz, "Efficient Mn(IV) Emission in Fluorine Coordination", Journal of The Electrochemical Society, Jul. 1973, pp. 942-947, vol. 120, Issue 7.
Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.
Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.
Kasa et al.,"Red and Deep Red Emissions from Cubic K2SiF6:Mn4+ and Hexagonal K2MnF6 Synthesized in HF/KMnO4/KHF2/Si Solutions", Journal of The Electrochemical Society, ECS, 2012, vol. 159, issue 4, J89-J95.
Nammalwar et al., "Phosphor Materials and Related Devices", U.S. Appl. 14/348,244, filed Mar. 28, 2014.
Murphy et al., "Method and System for Storage of Perishable Items", U.S. Appl. No. 13/665,514, filed Oct. 31, 2012.
Murphy, "Processes for Preparing Color Stable Manganese-Doped Phosphors", U.S. Appl. No. 61/868,633, filed Aug. 22, 2013.
Murphy et al., "Processes for Preparing Color Stable Manganese-Doped Complex Fluoride Phosphors", U.S. Appl. No. 61/915,927, filed Dec. 13, 2013.

* cited by examiner

LED PACKAGE WITH RED-EMITTING PHOSPHORS

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under use conditions. It is possible to reduce this degradation using post-synthesis processing steps, as described in U.S. Pat. No. 8,252,613. However, development of alternative methods for improving stability of the materials is desirable.

BRIEF DESCRIPTION

Briefly, in one aspect, the present invention relates to a process for fabricating a LED lighting apparatus including disposing a composite coating on a surface of a LED chip. The composite coating includes first composite layer having a manganese doped phosphor of formula I and a first binder, and a second composite layer having a second phosphor composition and a second binder. The first binder, the second binder or both comprise a poly(meth)acrylate.

$$A_x[MF_y]:Mn^{4+} \quad (I)$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion;
y is 5, 6 or 7.

In another aspect, a LED lighting apparatus according to the present invention includes a composite coating disposed on a LED chip. The composite coating includes first composite layer having a manganese doped phosphor of formula I and a first binder, and a second composite layer having a second phosphor composition and a second binder. The first binder, the second binder or both comprise a poly(meth) acrylate.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. In the following specification and claims, the singular forms "a", "an" and "the" include plural referents, unless the context clearly dictates otherwise.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated. The term "adjacent" as used herein means that the two layers are disposed contiguously and are in direct contact with each other.

Figure 1:
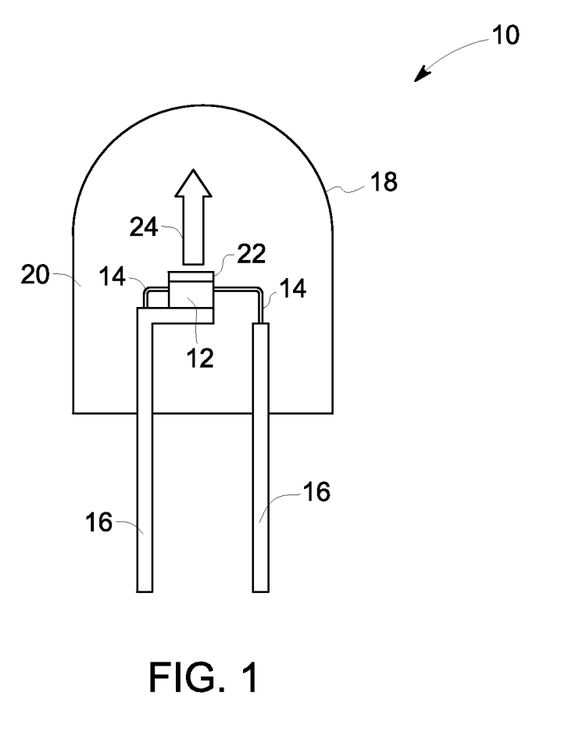
FIG. 1 is a schematic cross-sectional view of a lighting apparatus according to the present invention.

A cross sectional view of a lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to the LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. In one embodiment, the LED may contain at least one semiconductor layer comprising GaN, ZnSe, or SiC. In particular, the semiconductor light source may be a blue emitting LED semiconductor diode based on a nitride compound semiconductor of formula $In_iGa_jAl_kN$ (where $0 \le i$; $0 \le j$; $0 \le k$; and $I+j+k=1$) having an emission wavelength greater than about 250 nm and less than about 550 nm. More particularly, the LED chip 12 (FIG. 1) may be a near-UV or blue emitting LED having a peak emission wavelength from about 400 to about 500 nm. Such LED semiconductors are known in the art. The radiation source is described herein as a LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, a composite coating 22 is disposed on a surface of LED chip 12. The composite coating 22 includes a first composite layer and a second composite layer, each composite layer having at least one phosphor composition. In one instance, the phosphor compositions are radiationally coupled to the LED chip 12. Radiationally coupled means that the elements are associated with each other so that the radiation from one is transmitted to the other. For example, the composite coating 22 is disposed on the LED chip 12 such as a radiation from LED chip 12 is transmitted to the phosphors, and the phosphors emit radiation of different wavelengths.

In a particular embodiment, the LED chip 12 is a blue LED, and the first composite layer includes the red line emitting phosphor of formula I and the second composite layer includes a yellow-green phosphor such as a cerium-doped yttrium aluminum garnet, Ce:YAG. The blue light emitted by the LED chip 12 mixes with the red and yellow-green light emitted respectively by the phosphors of the first composite layer and the second composite layer, and the resulting emission (indicated by arrow 24) appears as white light.

LED chip 12 may be enclosed by an encapsulant material 20. The encapsulant material 20 may be a low temperature glass, or a thermoplastic or thermoset polymer or resin as is known in the art, for example, a silicone or epoxy resin. LED chip 12 and encapsulant material 20 may be encapsulated within a shell 18. Both the shell 18 and the encapsulant 20 should be transparent to allow white light 24 to be transmitted through those elements. In some embodiments, the encapsulant material may form the shell 18. In addition, scattering particles may be embedded in the encapsulant material. The scattering particles may be, for example, alumina or titania. The scattering particles effectively scatter the directional light emitted from the LED chip, preferably with a negligible amount of absorption.

In an alternate embodiment, the lamp 10 may only include an encapsulant material without an outer shell 18. The LED chip 1 may be supported, for example, by the lead frame 16, by the self-supporting electrodes, the bottom of shell 18 or by a pedestal (not shown) mounted to shell 18 or to the lead frame.

The manganese ($Mn^{4+}$)-doped phosphor of formula I is a red line emitting manganese ($Mn^{4+}$)-doped complex fluoride phosphor. In the context of the present invention, the term "complex fluoride material or phosphor", means a coordination compound, containing at least one coordination center, surrounded by fluoride ions acting as ligands, and charge-compensated by counter ions as necessary. In one example, $K_2SiF_6:Mn^{4+}$, the coordination center is Si and the counterion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

In particular embodiments, the coordination center of the phosphors, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of precursors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the precursor of formula I is $K_2SiF_6:Mn^{4+}$.

In one embodiment, the $Mn^{4+}$-doped phosphor is selected from the group consisting of
(A) $A_2[MF_5]:Mn^{4+}$, where A is selected from Li, Na, K, Rb, Cs, and combinations thereof; and where M is selected from Al, Ga, In, and combinations thereof;
(B) $A_3[MF_6]:Mn^{4+}$, where A is selected from Li, Na, K, Rb, Cs, and combinations thereof; and where M is selected from Al, Ga, In, and combinations thereof;
(C) $Zn_2[MF_7]:Mn^{4+}$, where M is selected from Al, Ga, In, and combinations thereof;
(D) $A[In_2F_7]:Mn^{4+}$ where A is selected from Li, Na, K, Rb, Cs, and combinations thereof;
(E) $A_2[MF_6]:Mn^{4+}$, where A is selected from Li, Na, K, Rb, Cs, and combinations thereof; and where M is selected from Ge, Si, Sn, Ti, Zr, and combinations thereof;
(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;
(G) $Ba_{0.65}Zr_{0.35}F_{2.70}:Mn^{4+}$; and
(H) $A_3[ZrF_7]:Mn^{4+}$ where A is selected from Li, Na, K, Rb, Cs, and combinations thereof.

The amount of manganese in the $Mn^{4+}$ doped precursors of formula I and groups (A)-(H), and in the product phosphors ranges from about 0.3 weight % (wt %) to about 2.5 wt %, (from about 1.2 mole % (mol %) to about 10 mol %), based on total weight of the precursor or the phosphor. In some embodiments, the amount of manganese ranges from about 0.3 wt % to about 1.5 wt % (from about 1.2 mol % to about 6 mol %), particularly from about 0.50 wt % to about 0.85 wt % (from about 2 mol % to about 3.4 mol %), and more particularly from about 0.65 wt % to about 0.75 wt % (from about 2.6 mol % to about 3 mol %). In other embodiments, the amount of manganese ranges from about 0.75 wt % to about 2.5 wt % (about 3 mol % to about 10 mol %), particularly from about 0.9 wt % to about 1.5 wt % (from about 3.5 mol % to about 6 mol %), more particularly from about 0.9 wt % to about 1.4 wt % (about 3.0 mol % to about 5.5 mol %), and even more particularly from about 0.9 wt % to about 1.3 wt % (about 3.5 mol % to about 5.1 mol %).

The $Mn^{4+}$ doped phosphors may have a population of particles having a particle size distribution with a D50 value in a range from about 10 micron to about 80 microns. The phosphor materials described herein are commercially available, or prepared by methods as known in the art, e.g., through solid-state reaction methods by combining, for example, elemental oxide, carbonates, and/or hydroxides as starting material. In some embodiments, it is desirable to use particles of small particle size, for example a D50 particle size of less than about 30 microns. In particular embodiments, the D50 particle size of the particles ranges from about 10 microns to about 20 microns, and more particularly from about 12 microns to about 18 microns. In some embodiments, the particles of the $Mn^{4+}$ doped phosphors are post-treated for enhancing performance and color stability of the resulting phosphors as described in U.S. Pat. No. 8,252,613.

Figure 2:
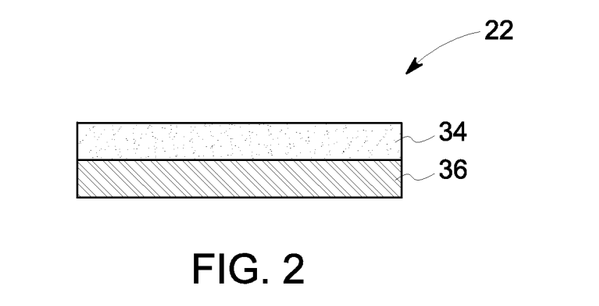
FIG. 2 is a schematic cross-sectional view through a composite coating according to one embodiment of the present invention.

FIG. 2 is a cross section view of a composite coating 22 (also referred to as "laminate") showing that composite coating 22 is composed of at least two layer; a first composite layer 34 and the second composite layer 36. The first composite layer 34 includes a manganese doped phosphor of formula I and a first binder. The second composite layer 36 includes a second phosphor (an additional phosphor) and a second binder. The second phosphor is a phosphor composition that emits a radiation which produces white light in combination with the emissions of the first composite layer 34 and the LED chip 12 (FIG. 1), which are described in detail below.

In one embodiment, a phosphor composition is interspersed in a binder material within a composite layer. The phosphor composition may be mixed with a binder material (or a binder) to form a composite phosphor material, which can be subsequently pressed to form a composite layer or film. The composite phosphor material may include the phosphor composition in the form of powder, and the binder material as a matrix. The matrix or the binder material may be an encapsulant material. Suitable examples of the binder materials may be a low temperature glass, or a thermoplastic or thermoset polymer or a resin as is known in the art, for example, a silicone or epoxy resin.

In one embodiment, the phosphor of formula I is mixed with a first binder and the mixture is heated and pressed to form the first composite layer 34. In one embodiment, the second phosphor is mixed with a second binder; and then heated and pressed to form the second composite layer 36. Both the first binder and the second binder should be transparent to the light emitted from the LED and the phosphors. In one embodiment, the first binder, the second binder, or both have a glass transition temperature ($T_g$) higher than the operating temperature of the LED chip. According to one embodiment of the invention, the first binder, the second binder or both are a poly(meth)acrylate polymer or copolymer. A suitable poly(meth)acrylate binder includes, but is not limited to, poly(methyl methacrylate) (PMMA). Many polymer and copolymer formulations derived from (meth)acrylic acid and (meth)acrylate ester monomers may be used for the binder. In some embodiments, both the first binder and the second binder are (meth)acrylates. In some embodiments, the second binder may be a different material from that of the first binder. Suitable examples of a different binder material may include, but are not limited to, mono and copolymers obtained from materials such as polycarbonates, cyclic olefins, polysulfones, polyesters, polystyrene, polyproplyene and fluorplastic resins.

In some embodiments, the binder material (the first binder or the second binder) has an index of refraction R, and contains a diluent material having less than about 5% absorbance and index of refraction of R±0.1. The diluent material has an index of refraction of ≤1.7, particularly ≤1.6, and more particularly ≤1.5. In a particular embodiment, the diluent material is of formula $A_x[MF_y]$, and has an index of refraction of about 1.4. Adding an optically inactive material to the phosphor/binder mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into the binder materials, for example acrylates before curing.

During pressing, the composite phosphor materials are heated at least up to their respective melting temperatures. In one embodiment, the heating temperature may range from about 150° C. to about 200° C. On heating, the binder materials soften; and the phosphor materials intersperse within the respective molten binders to form, respectively, the first composite layer 34 and the second composite layer 36.

These separately formed layers, the first composite layer 34 and the second composite layer 36, are subsequently disposed one over another, and bonded to form the composite coating 22. In one embodiment, the first composite layer 34 substantially covers the second composite layer 36 such that the light emitted by one of the layers passes through another layer. In some embodiments, the first composite layer 34 and the second composite layer 36 are cured to bond the two layers. During curing, the binder materials diffuse at the interface of the two layers 34 and 36, and form a bond (joint) between the two layers. Alternately, an adhesive can be used to join the two layers. The resulting composite coating 22 is then disposed on the LED chip 12. In some instances, a polymer layer or a silicone layer (not shown) can be used to adhere the composite coating 22 to the chip. In some embodiments, the composite coating 22 is arranged remotely in the vicinity of the LED chip 12.

The laminate or the composite coating can be molded in distinct shapes which can be placed directly over a LED on a board package or can be diced and placed on a LED package. One embodiment is a chip-scale package.

As mentioned above, the phosphor material (in the form of a powder) is interspersed in the binder material within the composite layer. The phosphor may be interspersed within a single region or particular regions of the layer, or throughout the entire volume of the binder material in the layer. The distribution of the phosphor material within the layer can be controlled by selecting particulates of the binder material of a suitable particle size. The particulates of the binder material may have a particle size distribution with a D50 value less than about 300 microns. In one embodiment, the particulates have a D50 particle size in a range from about 150 microns to about 300 microns. In one embodiment, smaller particulates, for example having D50 particle size less than about 50 microns, are desirable. In one embodiment, the binder particulates have a D50 particle size in a range from about 20 microns to about 50 microns.

The particle size of a binder material may be tailored to adjust the spacing between the phosphor particles in the composite layer. Using a large binder particulate size may result in large spacing among phosphor particles and high forward scattering of the LED emitted light. This may be accomplished mixing the phosphor with the binder at a temperature that is approximately the melting temperature of the binder. Since the viscosity of the polymer is high at this temperature, little or no dispersion (mixing or settling) of the phosphor particles occurs. Using small binder particle size may result in closely packed phosphor particles and less forward scattering with high absorption.

Referring to FIG. 1 again, blue light emitted by the LED chip 12 mixes with the light emitted by the first composite layer 34 and the second composite layer 36 (FIG. 2) of the composite coating 22, and the mixed light appears as white light. By controlling the particle size and/or distribution of particles (as discussed above) of the first and second phosphors, the binder materials or both prior to pressing into the first composite layer 34 and the second composite layer 36, the light emission from the individual layers can be tuned to produce desired color point.

Figure 3A:
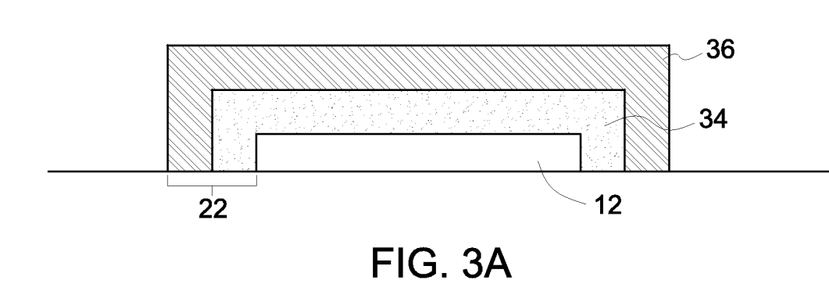
FIG. 3A shows cross-sectional view of a configuration of a composite coating disposed on a LED chip according to one embodiment of the present invention.
Figure 3B:
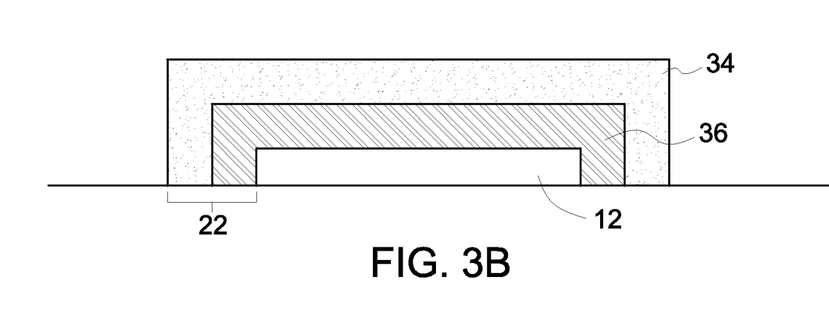
FIG. 3B shows cross-sectional view a configuration of a composite coating disposed on a LED chip according to another embodiment of the present invention.

In addition, the light emission can further be tuned by controlling the location (closer or farther from the LED chip 12) of the first phosphor and the second phosphor. FIGS. 3A and 3B show cross sectional views through LED chip 12 having the composite coating 22 disposed on the chip 12, depicting two configurations. In FIG. 3A, the composite coating 22 is disposed on the LED chip 12 such as to place the first composite layer 34 containing manganese doped phosphor of formula I, close (adjacent) to the LED chip 12. That is, in this configuration, the composite coating 22 is disposed on the LED chip 12 with the first composite layer 34 side disposed on the chip. In FIG. 3B, the composite coating 22 is disposed on the LED chip 12 with the second composite layer 36 disposed adjacent (down) to the LED chip 12, and the first composite layer 34 side (containing PFS) farther from the LED chip 12. For example, FIG. 4 and Table 1 show spectral characteristics of the two LED-based lamps, one having PFS-containing layer side disposed on the chip (PFS down) and another having YAG-containing layer side disposed on the chip (YAG down). These exemplary lamps and corresponding results are described in detail below in the example section.

Moreover, the first composite layer 34 containing the phosphor of formula I, may have a graded composition of the phosphor of formula I as described in U.S. patent application Ser. No. 14/073,141 filed on Nov. 6, 2013. The composition of the phosphor of formula I vary in one or more of manganese concentration, density of particles, or particle size across a thickness thereof, that is in a direction normal to the plane of the surface of the LED chip 12. In one embodiment, the manganese concentration ranges from a minimum value in a region proximate to the LED chip 12 to a maximum value in a region opposite to the LED chip 12. In one embodiment, the density of particles of the first population is greater than density of particles of the second population. In one embodiment, the D50 particle size of the first population of particles is greater than the D50 particle size of the second population of particles.

The phosphor particles may be disposed in a band structure, where a first population of particles is located generally in a region of the first composite layer 34 proximate to the LED chip and a second population of particles generally located in a region opposite to the LED chip. In some instances, the first composite layer 34 includes two separate layers disposed one over another; one having the first population of particles and another having a second population of particles. The first composite layer 34 may not have a distinct interface at which the composition changes abruptly. Particles of the first population may be mixed with particles of the second population throughout the first composite layer 34; however, in all of these embodiments, the layer 34 has a graded composition varying in one or more of manganese concentration, density of particles, or particle size.

In combination with the $Mn^{4+}$ doped phosphor and the second phosphor in the second composite layer 36, the LED chip produces resulting emissions with color point, color temperature, or color rendering as desired. When used in a lighting apparatus in combination with a blue or near UV LED emitting radiation in the range of about 250 to 550 nm, the resultant light emitted by the assembly will be a white light. The second phosphor may include a green, yellow, blue, red, orange, or other color phosphors that can be used in combination with the phosphor of formula I to customize the white color of the resulting light and produce specific spectral power distributions. In some instances, multiple composite layers, each including at least one phosphor composition, may be used to form the composite coating.

The green or yellow emitting phosphor materials may include one or more of europium doped or cerium doped rare earth oxides or oxynitride phosphors. More particularly, the second phosphor is a phosphor that emits yellow-green light upon excitation by the LED chip, for example a Ce-doped YAG, $(Y,Gd,Tb,La,Sm,Pr,Lu)_3(Al,Ga)_{5-x}O_{12-3/2x}:Ce^{3+}$ (wherein $0 \leq x \leq 0.5$).

Other suitable phosphors for use along with the phosphor of formula I include, but are not limited to:
$((Sr_{1-z}(Ca, Ba, Mg, Zn)_z)_{1-(x+w)}(Li, Na, K, Rb)_w Ce_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$;
$(Ca, Ce)_3Sc_2Si_3O_{12}$ (CaSiG);
$(Sr,Ca,Ba)_3Al_{1-x}Si_xO_{4+x}F_{1-x}:Ce^{3+}$ (SASOF));
$(Ba,Sr,Ca)_5(PO_4)_3(Cl,F,Br,OH):Eu^{2+},Mn^{2+}$; $(Ba,Sr,Ca)BPO_5:Eu^{2+}, Mn^{2+}$;
$(Sr,Ca)_{10}(PO_4)_6*vB_2O_3:Eu^{2+}$ (wherein $0<v\leq1$); $Sr_2Si_3O_8*2SrCl_2:Eu^{2+}$;
$(Ca,Sr,Ba)_3MgSi_2O_8:Eu^{2+}$, $Mn^{2+}$; $BaAl_8O_{13}:Eu^{2+}$; $2SrO*0.84P_2O_5*0.16B_2O_3:Eu^{2+}$;
$(Ba,Sr,Ca)MgAl_{10}O_{17}:Eu^{2+}$, $Mn^{2+}$; $(Ba,Sr,Ca)Al_2O_4:Eu^{2+}$; $(Y,Gd,Lu,Sc,La)BO_3:Ce^{3+}, Tb^{3+}$;
$ZnS:Cu^+$, $Cl^-$; $ZnS:Cu^+$, $Al^{3+}$; $ZnS:Ag^+$, $Cl^-$; $ZnS:Ag^+$, $Al^{3+}$; $(Ba,Sr,Ca)_2Si_{1-\xi}O_{4-2\xi}:Eu^{2+}$ (wherein $0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$;
$(Y,Gd,Tb,La,Sm,Pr,Lu)_3(Al,Ga)_{5-\alpha}O_{12-3/2\alpha}:Ce^{3+}$ (wherein $0\leq\alpha\leq0.5$);
$(Ca,Sr)_8(Mg,Zn)(SiO_4)_4Cl_2:Eu^{2+}$, $Mn^{2+}$; $Na_2Gd_2B_2O_7:Ce^{3+}, Tb^{3+}$;
$(Sr,Ca,Ba,Mg,Zn)_2P_2O_7:Eu^{2+}$, $Mn^{2+}$; $(Gd,Y,Lu,La)_2O_3:Eu^{3+}, Bi^{3+}$;
$(Gd,Y,Lu,La)_2O_2S:Eu^{3+}$, $Bi^{3+}$; $(Gd,Y,Lu,La)VO_4:Eu^{3+}, Bi^{3+}$; $(Ca,Sr)S:Eu^{2+}, Ce^{3+}$;
$SrY_2S_4:Eu^{2+}$; $CaLa_2S_4:Ce^{3+}$; $(Ba,Sr,Ca)MgP_2O_7:Eu^{2+}, Mn^{2+}$; $(Y,Lu)_2WO_6:Eu^{3+}, Mo^{6+}$;
$(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{8-x}O_x:Eu^{2+}$ (wherein $0\leq x\leq 2$); $Ca_3(SiO_4)Cl_2:Eu^{2+}$; $(Lu,Sc,Y,Tb)_{2-u-v}Ce_vCa_{1+u}Li_wMg_{2-w}P_w(Si, Ge)_{3-w}O_{12-u/2}$ (where $-0.5\leq u\leq1$, $0<v\leq0.1$, and $0\leq w\leq0.2$); $(Y,Lu,Gd)_{2-\varphi}Ca_\varphi Si_4N_{6+\varphi}C_{1-\varphi}:Ce^{3+}$, (wherein $0\leq\varphi\leq0.5$); $(Lu,Ca,Li,Mg,Y)$, $\alpha$-SiAlON doped with $Eu^{2+}$ and/or $Ce^{3+}$;
$(Ca,Sr,Ba)SiO_2N_2:Eu^{2+}$, $Ce^{3+}$; $\beta$-SiAlON:$Eu^{2+}$, $3.5MgO*0.5MgF_2*GeO_2:Mn^{4+}$;

(Sr,Ca,Ba)AlSiN$_3$:Eu$^{2+}$; (Sr,Ca,Ba)$_3$SiO$_5$:Eu$^{2+}$; Ca$_{1-c-f}$Ce$_c$Eu$_f$Al$_{1+c}$Si$_{1-c}$N$_3$, (where 0≤c≤0.2, 0≤f≤0.2); Ca$_{1-h-r}$Ce$_h$Eu$_r$Al$_{1-h}$(Mg,Zn)$_h$SiN$_3$, (where 0≤h≤0.2, 0≤r≤0.2); Ca$_{1-2s-t}$Ce$_s$(Li,Na)$_s$Eu$_t$AlSiN$_3$, (where 0≤s≤0.2, 0≤f≤0.2, s+t>0); and Ca$_{1-σ-χ-φ}$Ce$_σ$(Li,Na)$_χ$Eu$_φ$Al$_{1+σ-χ}$Si$_{1-σ+χ}$N$_3$, (where 0≤σ≤0.2, 0≤χ≤0.4, 0≤φ≤0.2).

Other materials suitable for use in combination with the phosphors in the composite coating 32 may include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylannine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Generally, in a composite layer having substantially uniformly dispersed phosphor particles, a total amount of absorbed LED radiation and emitted radiation by the phosphor depends upon the total mass of the phosphor within a composite layer. If mass of a phosphor is M in a composite layer of constant surface area A, and the thickness T, in one embodiment, the density M/(AT) of the phosphor ranges from about 0.10 g/cm$^3$ to about 1.5 g/cm$^3$. Further, the density may be in a range from about 0.25 g/cm$^3$ to about 0.75 g/cm$^3$.

In general, the ratio of each of the individual phosphors (the phosphor of formula I and the second phosphor) and their dispersion in the composite coating may vary depending on the characteristics of the desired light output. The relative proportions of the individual phosphors in the various embodiments may be adjusted such that when their emissions are blended and employed in a LED lighting device, there is produced visible light of predetermined x and y values on the CIE chromaticity diagram. As stated, a white light is preferably produced. The white light may, for instance, may possess an x value in the range of about 0.30 to about 0.55, and a y value in the range of about 0.30 to about 0.55. As stated, however, the exact identity and amounts of each phosphor in the composite coating can be varied according to the needs of the end user.

EXAMPLES

The examples that follow are merely illustrative, and should not be construed to be any sort of limitation on the scope of the claimed invention.
General Procedures
Composite Laminate Sample Preparation Two sample were prepared by separately mixing Poly (methyl methacrylate) i.e. PMMA (Aldrich) (120,000 molecular weight by GPC) with K$_2$SiF$_6$:Mn$^{4+}$ (PSF) and YAG. 300 microns (um) sieved 4.5 g PMMA was combined with 2.5 g K$_2$SiF$_6$:Mn (5 mol % Mn, particle size 20 um), and the mixture was re-sieved (300 um) to prepare sample mixture 1. 150 um sieved 4.9 g PMMA was combined with 0.59 g YAG (Aldrich), and the mixture was re-sieved (150 um) to prepare sample mixture 2. The two sample mixtures were individually degassed in a vacuum chamber for about 15 minutes. The sample 1 mixture was poured into a disc-shaped mold of 7.5 cm diameter and 400 um thick, and the sample 2 mixture was poured into a disc-shaped mold of 7.5 cm diameter and 200 um thick. Each mold containing a mixture was then pressed under 80 psi pressure in vacuum at 200° C. followed by frame pressing under 550 psi pressure at 175° C. During both the pressings, pressure was released after the temperature was come down below 70° C. The sample tape 1 containing PFS was about 410 um thick, and the sample tape 2 containing YAG was about 205 um thick. The two circular tapes were stacked one over another, and a release film was placed above and below the stack. The stack was placed into the vacuum lamination tool and heated up to 180° C.; and pressed under 80 psi pressure to bond the two tapes. The stack was then cooled under pressure. The resulting composite laminate was about 615 um thick with distinct areas of YAG or PSF phosphor.

Luminescent Intensity Measurements

Figure 4:
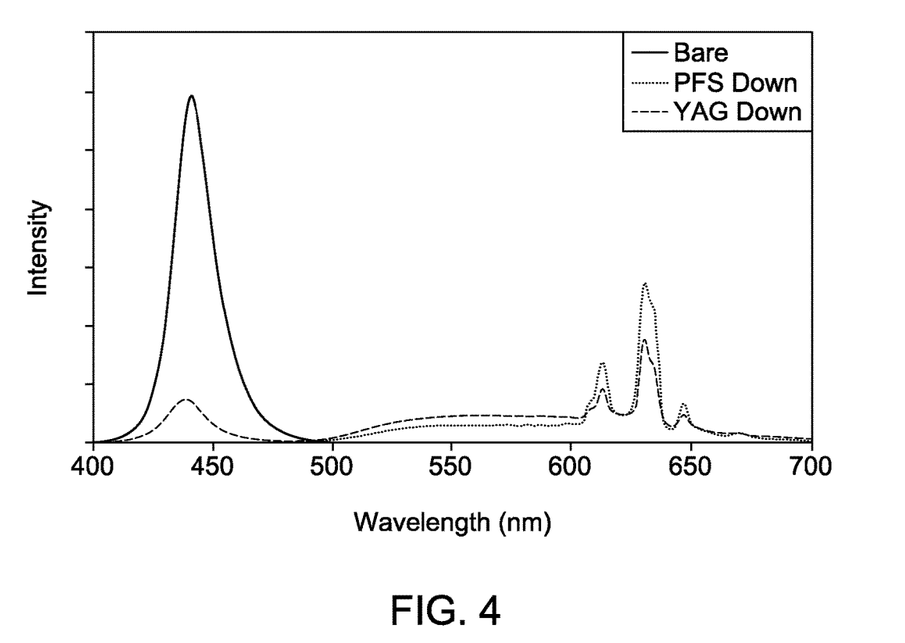
FIG. 4 shows emission spectra of two configurations of the composite coating shown in FIGS. 3A and 3B.

Two samples (sample 1 and sample 2) were prepared by separately disposing composite laminates (as prepared above) on blue LED chips (peak emission at 450 nm). The composite laminates were adhered to the LED chips with the help of silicone layers. For sample 1, the composite laminate was disposed on a LED chip with the PFS-containing side on the LED chip (PFS Down), and for sample 2, YAG-containing surface of the composite laminate was placed on a LED chip (YAG Down). FIG. 4; shows emission spectra; and Table 1 shows spectral characteristics of sample 1 and sample 2.

TABLE 1

| Sample | CRI | CCT | CIE-x | CIE-y | DBB |
| --- | --- | --- | --- | --- | --- |
| Sample 1 (PFS Down) | 92.8 | 2092 | 0.498 | 0.389 | −0.026 |
| Sample 2 (YAG Down) | 77 | 2891 | 0.460 | 0.436 | 0.025 |

It is clear from measurements (FIG. 4 & Table 1) that sample 1 has a distinctly higher CRI and lower CCT than sample 2.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for fabricating a LED lighting apparatus, comprising:
    forming a first composite layer comprising a first phosphor composition of formula I and a first binder, $$A_x [MF_y]:Mn^{4+} \qquad (I)$$

wherein,
    A is Li, Na, K, Rb, Cs, or combinations thereof;
    M is Si, Ge, Sn, Ti, Zr, Al, Ga, In, Sc, Hf, Y, La, Nb, Ta, Bi, Gd, or combinations thereof;
    x is the absolute value of the charge of the [MF$_y$] ion;
    y is 5, 6 or 7;
    forming a second composite layer comprising a second phosphor composition and a second binder, wherein the first binder, the second binder or both comprise a poly(meth)acrylate, and wherein forming the first composite layer, the second composite layer or both comprises:
selecting a particle size distribution of particulates for one or both the first binder and the second binder, wherein the particle size distribution has a D50 value from about 150 microns to about 300 microns; and
mixing the first phosphor composition with the particulates of the first binder and pressing a mixture of the first phosphor composition and the first binder at approximately melting temperature of the first binder to form the first composite layer, and mixing the second phosphor composition with the particulates of the second binder and pressing a mixture of the second phosphor composition and the second binder at approximately melting temperature of the second binder to form the second composite layer, thereby controlling a distribution of the first phosphor composition in the first composite layer and the second phosphor composition in the second composite layer,
forming a composite coating by disposing the first composite layer on the second composite layer, and
disposing the composite coating on a LED.

2. The process according to claim 1, wherein forming the composite coating further comprises bonding the first composite layer to the second composite layer.

3. The process according to claim 2, wherein the first composite layer and the second composite layer are bonded by an adhesive.

4. The process according to claim 2, wherein bonding comprises curing the first composite layer and the second composite layer.

5. The process according to claim 1, wherein the first phosphor composition of formula I comprises a population of particles having a particle size distribution with a D50 value in a range from about 20 microns to about 50 microns.

6. The process according to claim 1, wherein the first phosphor composition of formula I comprises a population of particles having a particle size distribution with a D50 value in a range from about 10 microns to about 30 microns.

7. The process according to claim 1, wherein the poly (meth)acrylate is poly(methyl methacrylate).

8. The process according to claim 1, wherein the first phosphor composition is $K_2SiF_6:Mn^{4+}$.

* * * * *